United States Patent
Hsu

(10) Patent No.: US 8,022,513 B2
(45) Date of Patent: Sep. 20, 2011

(54) PACKAGING SUBSTRATE STRUCTURE WITH ELECTRONIC COMPONENTS EMBEDDED IN A CAVITY OF A METAL BLOCK AND METHOD FOR FABRICATING THE SAME

(75) Inventor: Shih-Ping Hsu, Hsinchu (TW)

(73) Assignee: Unimicron Technology Corp., Taoyuan (TW)

( * ) Notice: Subject to any disclaimer, the term of this patent is extended or adjusted under 35 U.S.C. 154(b) by 213 days.

(21) Appl. No.: 12/230,273

(22) Filed: Aug. 27, 2008

(65) Prior Publication Data

US 2009/0057913 A1 Mar. 5, 2009

(30) Foreign Application Priority Data

Aug. 28, 2007 (TW) ................... 96131899 A

(51) Int. Cl.
*H01L 23/52* (2006.01)
*H01L 21/00* (2006.01)

(52) U.S. Cl. ......... 257/668; 257/E23.141; 257/E21.001; 257/E21.499; 257/680; 257/774; 257/685; 257/686; 257/723; 257/777; 257/684; 257/796; 257/698; 257/705; 361/760; 174/260

(58) Field of Classification Search .................. 257/668, 257/774, E23.141, E21.001, 680, 685, 686, 257/723, 777, 684, 796, 698, E21.499, 705; 438/118; 174/260; 361/760
See application file for complete search history.

(56) References Cited

U.S. PATENT DOCUMENTS

| 6,239,980 | B1 * | 5/2001 | Fillion et al. | 361/760 |
|---|---|---|---|---|
| 2007/0074900 | A1 * | 4/2007 | Lee et al. | 174/260 |
| 2008/0054443 | A1 * | 3/2008 | Shih | 257/698 |
| 2008/0151518 | A1 * | 6/2008 | Hsu et al. | 361/762 |
| 2008/0165515 | A1 * | 7/2008 | Hsu et al. | 361/783 |
| 2008/0196931 | A1 * | 8/2008 | Lee et al. | 174/260 |
| 2008/0230886 | A1 * | 9/2008 | Wong et al. | 257/686 |
| 2009/0046432 | A1 * | 2/2009 | Hsu | 361/717 |
| 2009/0057873 | A1 * | 3/2009 | Hsu | 257/700 |
| 2010/0140782 | A1 * | 6/2010 | Kim et al. | 257/690 |
| 2010/0159647 | A1 * | 6/2010 | Ito et al. | 438/124 |

* cited by examiner

*Primary Examiner* — A Williams
(74) *Attorney, Agent, or Firm* — Bacon & Thomas, PLLC

(57) ABSTRACT

A packaging substrate structure with electronic components embedded therein and a method for fabricating the same are disclosed. The packaging substrate structure comprises a core board with a wiring layer on the two opposite surfaces thereof; a first built-up structure disposed on at least one surface of the core board and having a cavity to expose the surface of the core board; an electronic component disposed in the cavity and having an active surface and an inactive surface, where the active surface has pluralities of electrode pads and the inactive surface faces the surface of the core board; and a solder mask disposed on the surfaces of the first built-up structure and the electronic component, where the solder mask has pluralities of first openings to expose the electrode pads of the electronic component. Accordingly, the packaging substrate disclosed by the present invention can efficiently enhance electrical performance and product reliability.

9 Claims, 4 Drawing Sheets

PACKAGING SUBSTRATE STRUCTURE WITH ELECTRONIC COMPONENTS EMBEDDED IN A CAVITY OF A METAL BLOCK AND METHOD FOR FABRICATING THE SAME

BACKGROUND OF THE INVENTION

1. Field of the Invention

The present invention relates to a packaging substrate structure with electronic components embedded therein and a method for fabricating the same and, more particularly, to a packaging substrate structure with electronic components embedded therein, which exhibits enhanced electrical performance and reliability, and a method for fabricating the same.

2. Description of Related Art

As the electronic industry develops rapidly, the technology of semiconductor packaging accordingly moves towards integration and miniaturization so that the demands such as multifunction and high efficiency in electronic devices can be met. In addition, packaging substrates with many active and passive components and circuit connections thereon have advanced from being single-layered boards to multiple-layered boards to expand the space for wiring layout in a limited packaging substrate and to meet the demand of the application of high-density integrated circuits.

With reference to FIG. 1, a flip chip ball grid array (FCBGA) substrate is optimally applied in semiconductor packaging. Herein, the active surface 11a of the chip 11 can be electrically connected to the surface 13a (for adhering a chip) of the packaging substrate 13 by a plurality of solder bumps 12. In addition, according to the design demand, the surface 13a (for adhering a chip) of the packaging substrate 13 can further electrically connect to at least one passive component 14, and a plurality of solder balls 15 can be disposed on the other surface of the packaging substrate 13 to function as I/O joints. The aforementioned structure has become mainstream technology for packaging chips and electronic components.

However, in a flip chip ball grid array package structure, the passive components 14 are disposed outside of the packaging substrate 13 by surface mount technology (SMT). Thereby, when a significant amount of passive components 14 are disposed on the surface of the packaging substrate 13 according to the design demand, it is necessary to increase the surface area of the packaging substrate 13 to dispose the increased passive components 14 thereon. Accordingly, the purpose of miniaturization cannot be achieved. In addition, the number of the passive components 14 is limited to the restricted area of the packaging substrate 13, and thereby the demands for high-density packaging have not been met.

Furthermore, the fact that passive components 14 are disposed on the surface of the packaging substrate 13 causes long transmission paths, large parasitic induction, poor electrical performance and thus the accuracy of signal transmission is badly influenced. Besides, the passive components 14 disposed on the surface of the packaging substrate 13 make the height of the package structure increase and thus the demand for a light and compact-sized product cannot be met.

SUMMARY OF THE INVENTION

The object of the present invention is to provide a packaging substrate structure with electronic components embedded therein and a method for fabricating the same so as to save the wiring layout space and enhance electrical quality.

To achieve the object, the present invention provides a packaging substrate structure with electronic components embedded therein, comprising: a core board with a wiring layer disposed on the two opposite surfaces thereof; a first built-up structure disposed on at least one surface of the core board and having a cavity to expose the surface of the core board; an electronic component disposed in the cavity and having an active surface and an inactive surface, herein the active surface has a plurality of electrode pads, and the inactive surface faces the surface of the core board; and a solder mask disposed on the surfaces of the first built-up structure and the electronic component, herein the solder mask has a plurality of first openings to expose the electrode pads of the electronic component. Herein, the first built-up structure can have at least one first dielectric layer, at least one first wiring layer disposed on the first dielectric layer, and a plurality of first conductive vias electrically connecting to the first wiring layer, and the outmost first wiring layer of the first built-up structure can have a plurality of conductive pads. In addition, the solder mask can further have a plurality of second openings to expose the conductive pads of the first built-up structure.

In the packaging substrate structure of the present invention, preferably, at least one first wiring layer in the first built-up structure has a metal layer disposed around the cavity. In addition, the wiring layer on the surface of the core board also can have a metal layer corresponding to the cavity of the first built-up structure for attaching the inactive surface of the electronic component. Accordingly, during the operation of the electronic component, the heat generated from the electronic component in the cavity can be efficiently dissipated through the metal layer so as to enhance the performance and lifetime of the electronic component.

The packaging substrate structure of the present invention can further comprise a second built-up structure disposed between the solder mask and the first built-up structure together with the electronic component, and the second built-up structure can have a plurality of second conductive vias. Herein, a part of the second conductive vias electrically connect to the conductive pads of the first built-up structure, and another part of the second conductive vias electrically connect to the electrode pads of the electronic component.

The packaging substrate structure of the present invention can further comprise an adhesive layer disposed between the inactive surface of the electronic component and the surface of the core board.

The packaging substrate structure of the present invention can further comprise an adhesive material filling a gap between the cavity and the electronic component to fix the electronic component.

In the packaging substrate structure of the present invention, the width of the cavity increases from inside to outside.

The present invention further provides a method for fabricating a packaging substrate structure with electronic components embedded therein, comprising: providing a core board with a wiring layer disposed on the two opposite surfaces thereof; forming a first built-up structure on at least one surface of the core board, herein the first built-up structure has a metal block, and removing a part of the metal block by etching to form a cavity and expose the surface of the core board; placing an electronic component in the cavity, herein the electronic component has an active surface and an inactive surface, the active surface has a plurality of electrode pads, and the inactive surface faces the surface of the core board; and forming a solder mask on the surfaces of the first built-up structure and the electronic component, herein the solder mask has a plurality of first openings to expose the electrode pads of the electronic component. Herein, the first built-up structure can have at least one first dielectric layer, at least one first wiring layer disposed on the first dielectric layer, and a plurality of first conductive vias electrically connecting to the first wiring layer, and the outmost first wiring layer of the first built-up structure can have a plurality of conductive pads. In addition, the solder mask can further have a plurality of second openings to expose the conductive pads of the first built-up structure.

In the aforementioned method, the first built-up structure can be formed by the following steps: (a1) forming a first dielectric layer, and forming a predetermined cavity and a plurality of vias in the first dielectric layer; (a2) forming a seed layer on the surfaces of the first dielectric layer, the predetermined cavity and the vias; (a3) forming a patterned resist layer on the surface of the seed layer, herein the patterned resist layer has open areas and parts of the open areas correspond to the predetermined cavity and the vias of the first dielectric layer to expose the seed layer; (a4) forming a first wiring layer, a plurality of first conductive vias and a metal block in the open areas by electroplating; (a5) removing the patterned resist layer and the seed layer thereunder; and (a6) repeating steps (a1) to (a5) to form a multilayer built-up structure.

The method of the present invention can further comprise a step for forming a second built-up structure between the solder mask and the first built-up structure together with the electronic component, and the second built-up structure can has a plurality of second conductive vias. Herein, a part of the second conductive vias electrically connect to the conductive pads of the first built-up structure, and another part of the second conductive vias electrically connect to the electrode pads of the electronic component.

In the method of the present invention, while the cavity is formed in the first built-up structure by etching, at least one first wiring layer forms a metal layer surrounding the cavity.

In the method of the present invention, the wiring layer on the surface of the core board also can have a metal layer corresponding to the cavity of the first built-up structures for attaching the inactive surface of the electronic component.

In the method of the present invention, the inactive surface of the electronic component is attached to the surface of the core board through an adhesive layer.

The method of the present invention can further comprise a step for filling a gap between the cavity and the electronic component with an adhesive material to fix the electronic component.

Other objects, advantages, and novel features of the invention will become more apparent from the following detailed description when taken in conjunction with the accompanying drawings.

DETAILED DESCRIPTION OF THE PREFERRED EMBODIMENT

Because the specific embodiments illustrate the practice of the present invention, a person having ordinary skill in the art can easily understand other advantages and efficiency of the present invention through the content disclosed therein. The present invention can also be practiced or applied by other variant embodiments. Many other possible modifications and variations of any detail in the present specification based on different outlooks and applications can be made without departing from the spirit of the invention.

Method Embodiment 1

Figure 1:
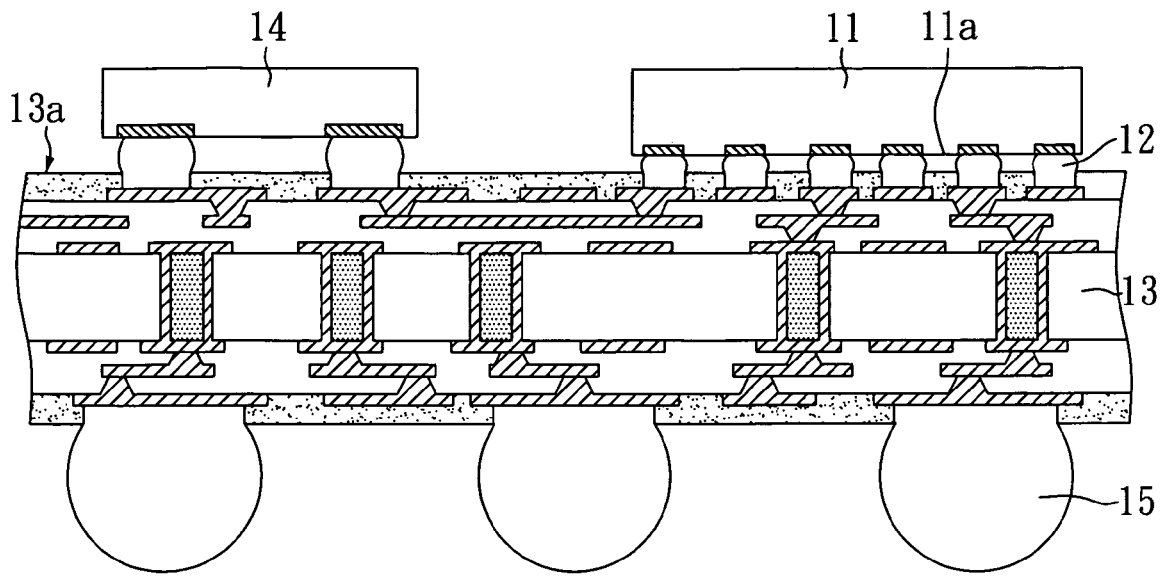
FIG. 1 is a cross-sectional view of a conventional packaging substrate structure having passive components mounted thereon.
Figure 2A:
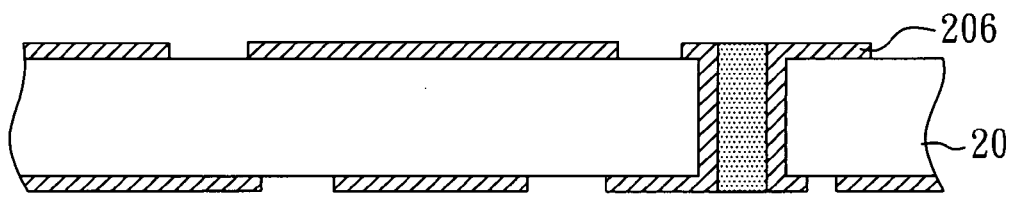
FIGS. 2A to 2D are cross-sectional views for illustrating a process for manufacturing a packaging substrate structure with an electronic component embedded therein of a preferred embodiment of the present invention.

With reference to FIG. 2A, a core board 20 with a wiring layer 206 disposed on two opposite surface thereof is first provided.

Figure 2B:
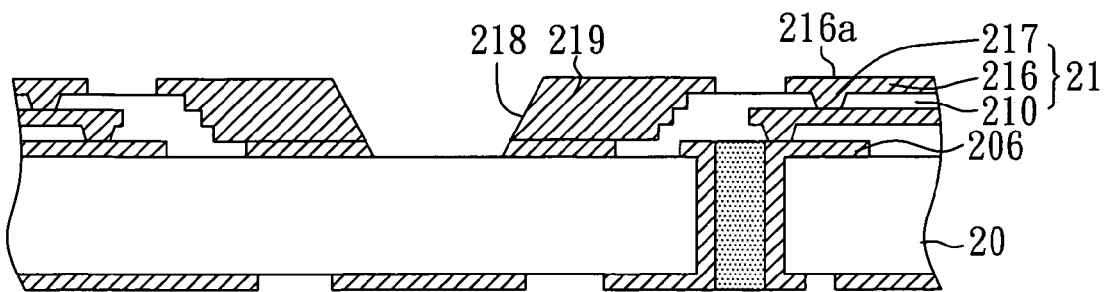

Subsequently, as shown in FIG. 2B, a first built-up structure 21 is formed on at least one surface of the core board 20. Herein, the first built-up structure 21 has a metal block including a metal layer 219, and a cavity 218 is formed by etching and removing a part of the metal block to expose the surface of the core board 20. In addition, the first built-up structure 21 has at least one first dielectric layer 210, at least one first wiring layer 216 disposed on the first dielectric layer 210, and a plurality of first conductive vias 217 electrically connecting to the first wiring layer 216, and the outmost first wiring layer 216 of the first built-up structure 21 has a plurality of conductive pads 216a. With reference to FIGS. 3A to 3F, there is shown a process for forming the first built-up structure 21. As shown in FIG. 3A, a first dielectric layer 210 is formed on at least one side of the core board 20, and a predetermined cavity 211 and a plurality of vias 212 are formed in the first dielectric layer 210. Subsequently, as shown in FIG. 3B, a seed layer 213 is formed on the surfaces of the first dielectric layer 210, the predetermined cavity 211 and the vias 212. Then, as shown in FIG. 3C, a patterned resist layer 214 is formed on the surface of the seed layer 213, and the patterned resist layer 214 has open areas 215. Herein, parts of the open areas 215 correspond to the predetermined cavity 211 and the vias 212 of the first dielectric layer 210 to expose the seed layer 213. As shown in FIG. 3D, a first wiring layer 216, a plurality of first conductive vias 217 and a metal block in the predetermined cavity 211 are formed in the open areas 215 by electroplating. Next, as shown in FIG. 3E, the patterned resist layer and the seed layer thereunder are removed. Finally, as shown in FIG. 3F, a multilayer built-up structure is formed by repeating the steps shown in FIGS. 3A to 3E. With reference to FIG. 2B, while a cavity 218 is formed in the first built-up structure 21 by etching to expose the surface of the core board 20, at least one first wiring layer 216 forms a metal layer 219 surrounding the cavity 218. Herein, the first built-up structure shown in FIGS. 2B to 2E and FIGS. 4 and 5 comprises the seed layer 213 as shown in FIG. 3F. However, in order to clarify the figures, the seed layer is not shown.

Figure 2C:
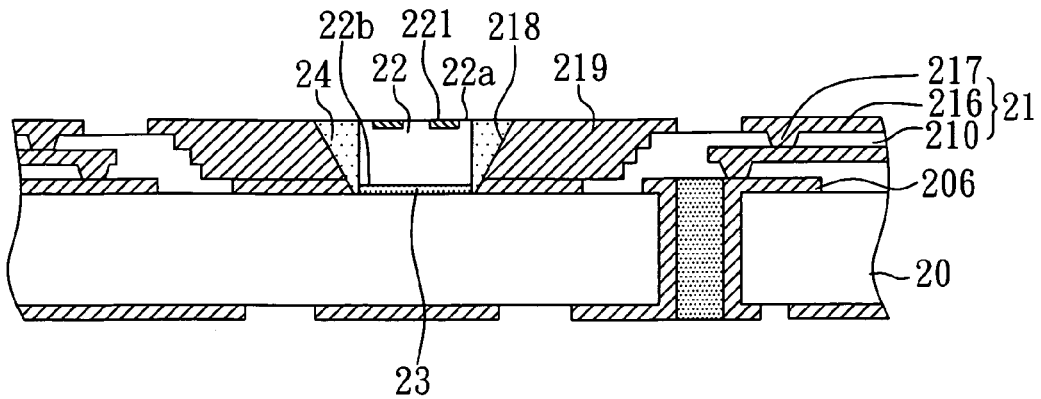
Figure 2D:
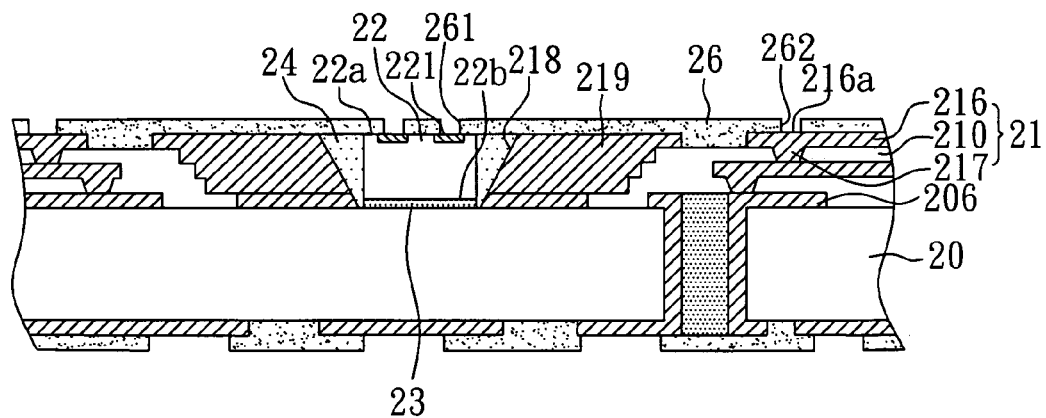
Figure 3A:
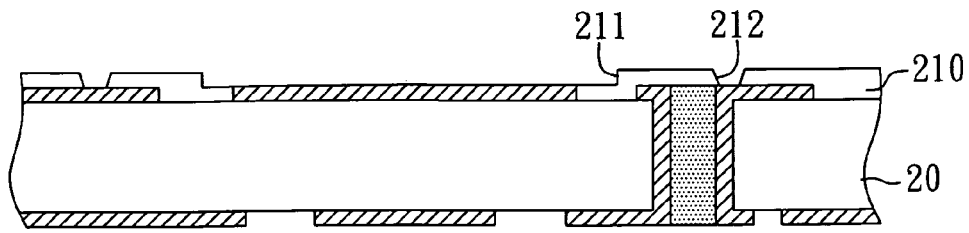
FIGS. 3A to 3F are cross-sectional views for illustrating a process for fabricating a first built-up structure of a preferred embodiment of the present invention.
Figure 3B:
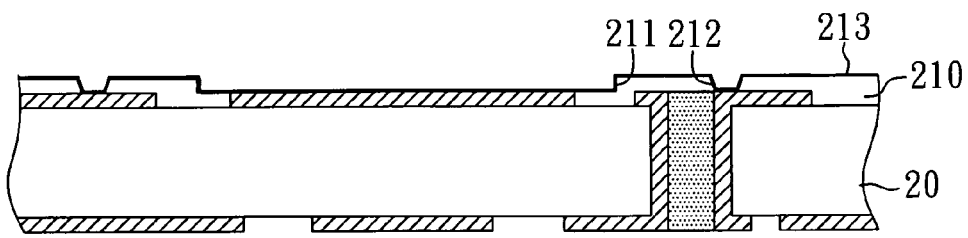
Figure 3C:
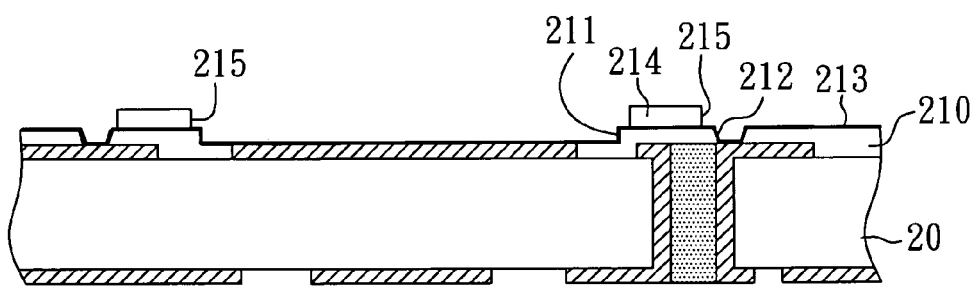
Figure 3D:
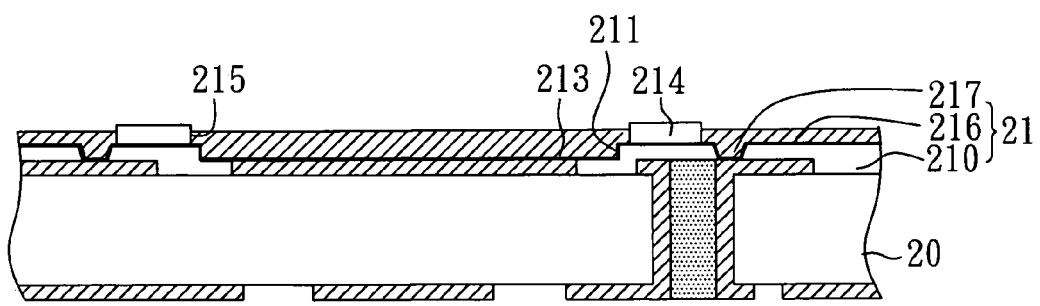
Figure 3E:
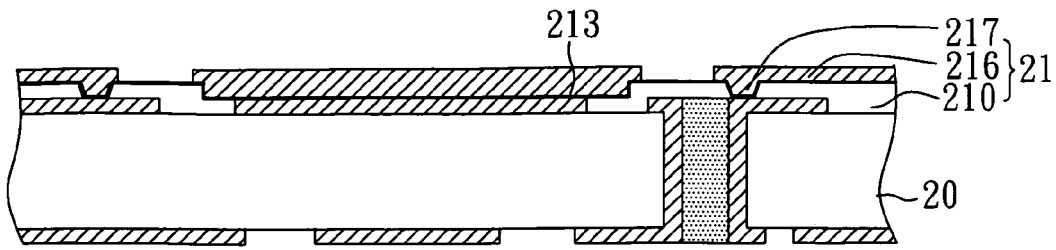
Figure 3F:
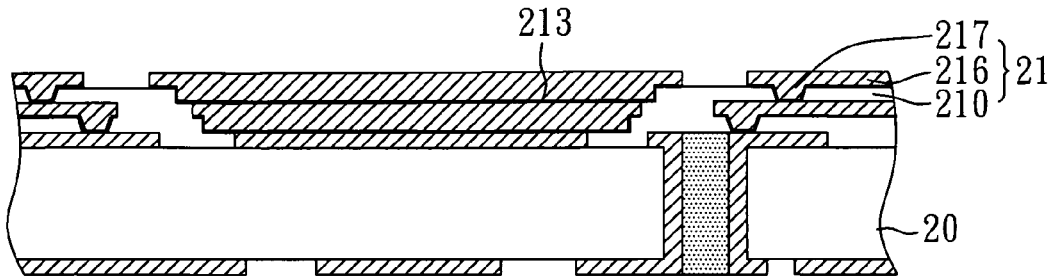

Subsequently, as shown in FIG. 2C, an electronic component 22 is placed in the cavity 218. The inactive surface 22b of the electronic component 22 is attached to the surface of the core board 20 through an adhesive layer 23. In addition, the gap between the cavity 218 and the electronic component 22 is filled with an adhesive material 24 to fix the electronic component 22. Herein, the electronic component 22 has an active surface 22a and an inactive surface 22b. The active surface 22a has a plurality of electrode pads 221, and the inactive surface 22b faces the core board 20. Finally, as shown in FIG. 2D, a solder mask 26 is formed on the surfaces of the first built-up structure 21 and the electronic component 22, and the solder mask 26 has a plurality of first openings 261 and second openings 262 to expose the electrode pads 221 of the electronic component 22 and the conductive pads 216a of the first built-up structure 21, respectively. Herein, the electrode pads 221 and the conductive pads 216a can electrically connect to other electronic components through solder bumps (not shown in the figures).

In the present embodiment, the electronic component 22 can be a passive component, and the electrode pads 221 thereof can directly connect to an IC chip (not shown in the figures) through solder bumps (not shown in the figures) so as to shorten the transmission paths and enhance the electrical performance.

Figure 2E:
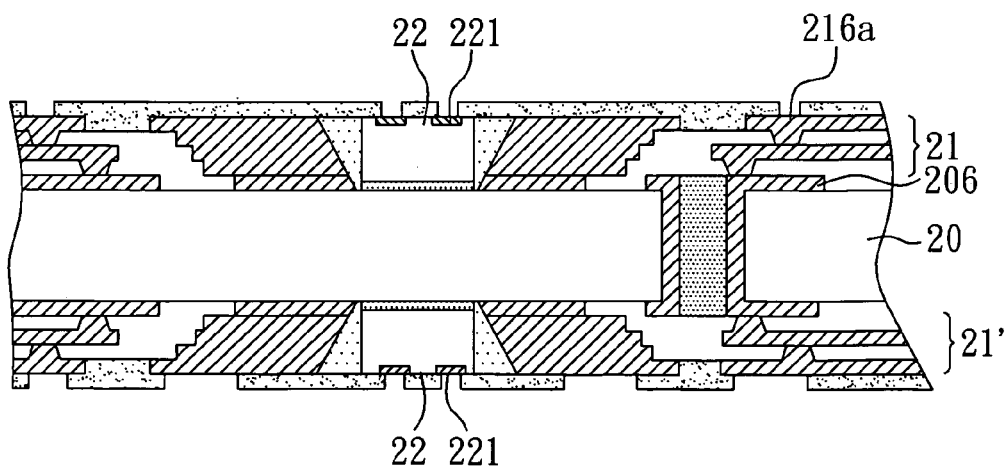
FIG. 2E is a cross-sectional view of a packaging substrate structure with electronic components embedded therein of another preferred embodiment of the present invention.

As shown in FIG. 2E, the built-up structures 21 and 21' with electronic components embedded therein also can be symmetrically formed on both sides of the core board 20 by the aforementioned process Structure Embodiment 1

With reference to FIGS. 2D and 2E, the packaging substrate structure with electronic components embedded therein according to the present embodiment comprises: a core board 20 with a wiring layer 206 disposed on the two opposite surfaces thereof; a first built-up structure 21 disposed on at least one surface of the core board 20 and having a cavity 218 to expose the surface of the core board 20; an electronic component 22 disposed in the cavity 218 and having an active surface 22a and an inactive surface 22b, herein the active surface 22a has a plurality of electrode pads 221, and the inactive surface 22b faces the surface of the core board 20; and a solder mask 26 disposed on the surfaces of the first built-up structure 21 and the electronic component 22, herein the solder mask 26 has a plurality of first openings 261 to expose the electrode pads 221 of the electronic component 22.

In the aforementioned structure, the first built-up structure 21 has at least one first dielectric layer 210, at least one first wiring layer 216 disposed on the first dielectric layer 210, and a plurality of first conductive vias 217 electrically connecting to the first wiring layer 216, and the outmost first wiring layer 216 of the first built-up structure 21 has a plurality of conductive pads 216a. In addition, at least one first wiring layer 216 in the first built-up structure 21 has a metal layer 219 disposed around the cavity 218 to dissipate the heat generated from the electronic component 22 in the cavity 218 during the operation of the electronic component 22 so as to enhance the performance and lifetime of the electronic component 22.

In the aforementioned structure, the solder mask 26 further has a plurality of second openings 262 to expose the conductive pads 216a of the first built-up structure 21.

The aforementioned structure further comprises an adhesive layer 23 disposed between the inactive surface 22b of the electronic component 22 and the surface of the core board 20.

The aforementioned structure further comprises an adhesive material 24 filling the gap between the cavity 218 and the electronic component 22 to fix the electronic component 22.

In the aforementioned structure, the width of the cavity 218 increases from inside to outside.

Method and Structure Embodiment 2

Figure 4:
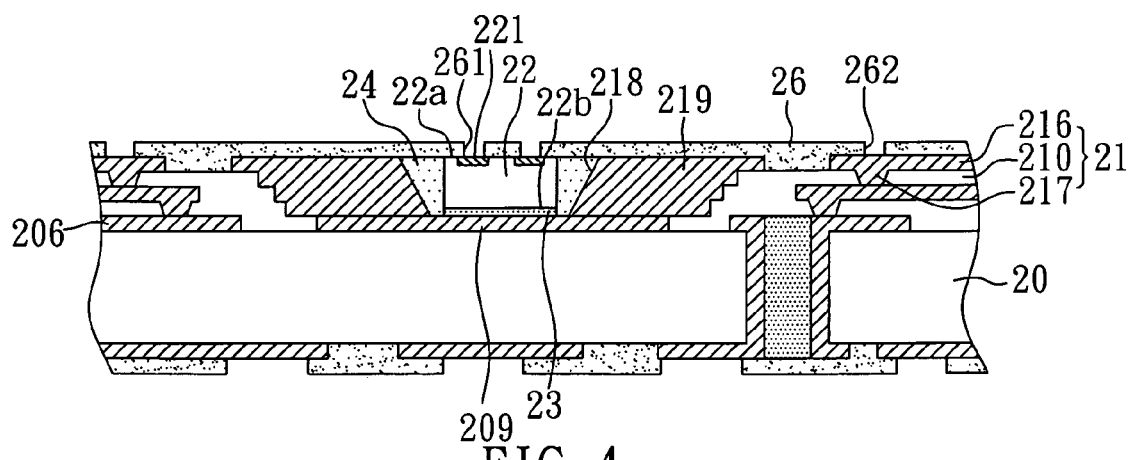
FIG. 4 is a cross-sectional view of a packaging substrate structure with an electronic component embedded therein of another preferred embodiment of the present invention.

The method and the structure in the present embodiment are the same as those in Method Embodiment 1 and Structure Embodiment 1, except that, as shown in FIG. 4, the wiring layer 206 on the surface of the core board 20 has a metal layer 209 corresponding to the cavity 218 of the first built-up structure 21 for attaching the inactive surface 22b of the electronic component 22.

Method and Structure Embodiment 3

Figure 5:
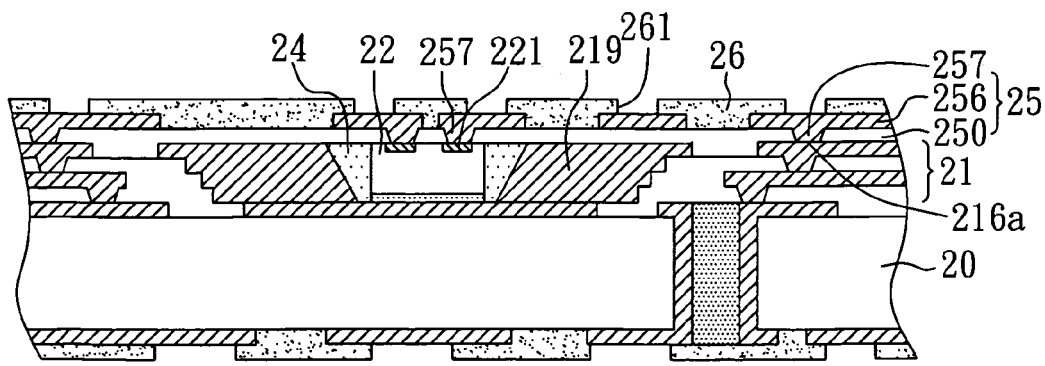
FIG. 5 is a cross-sectional view of a packaging substrate structure with an electronic component embedded therein of another preferred embodiment of the present invention

The method and the structure in the present embodiment are the same as those in Method Embodiment 1 and Structure Embodiment 1, except that, as shown in FIG. 5, a second built-up structure 25 can be formed between the solder mask 26 and the first built-up structure 21 and the electronic component 22. Herein, the second built-up structure 25 has at least one second dielectric layer 250, at least one second wiring layer 256 disposed on the second dielectric layer 250, and a plurality of second conductive vias 257. In addition, a part of the second conductive vias 257 in the second built-up structure 25 electrically connect to the conductive pads 216a of the first built-up structure 21, and another part of the second conductive vias 257 electrically connect to the electrode pads 221 of the electronic component 22.

Although the present invention only illustrates the structure where the built-up structure is formed on only one side of the core board and the method for fabricating the same, the scope of the present invention is not limited thereto. In practice, the built-up structure also can be formed on two sides of a packaging substrate.

The packaging substrate structure with electronic components embedded therein and the method for fabricating the same according to the present invention can improve the drawbacks occurring in a conventional package form, such as excessive space consumption for placing capacitors on the surface of a packaging substrate, long transmission paths, high parasitic capacitance, poor electrical performance, and the large height resulting in that the demands for a light and compact-sized product cannot be met. Accordingly, the packaging substrate structure with electronic components embedded therein and the method for fabricating the same according to the present invention can efficiently save the wiring layout space and enhance electrical quality.

Although the present invention has been explained in relation to its preferred embodiment, it is to be understood that many other possible modifications and variations can be made without departing from the scope of the invention as hereinafter claimed.

What is claimed is:

1. A packaging substrate structure with electronic components embedded therein, comprising:
   a core board with a wiring layer disposed on the two opposite surfaces thereof;
   a first built-up structure disposed on at least one surface of the core board and having a metal block penetrating through the first built-up structure, wherein the metal block consists of a plurality of stacked metal layers and the metal block has a cavity to expose the surface of the core board;
   an electronic component disposed in the cavity and having an active surface and an inactive surface, wherein the active surface has a plurality of electrode pads, and the inactive surface faces the surface of the core board; and a solder mask disposed on the surfaces of the first built-up structure and the electronic component, wherein the solder mask has a plurality of first openings to expose the electrode pads of the electronic component.

2. The packaging substrate structure as claimed in claim 1, wherein the first built-up structure has at least one first dielectric layer, at least one first wiring layer disposed on the first dielectric layer, and a plurality of first conductive vias electrically connecting to the first wiring layer, and the outmost first wiring layer of the first built-up structure has a plurality of conductive pads.

3. The packaging substrate structure as claimed in claim 1, wherein the core board has a metal layer disposed on at least one surface thereof, and the metal layer corresponds to the cavity of the first built-up structure for attaching the inactive surface of the electronic component.

4. The packaging substrate structure as claimed in claim 2, wherein the solder mask further has a plurality of second openings to expose the conductive pads of the first built-up structure.

5. The packaging substrate structure as claimed in claim 4, further comprising a plurality of solder bumps disposed on the surfaces of the conductive pads and the electrode pads.

6. The packaging substrate structure as claimed in claim 4, further comprising a second built-up structure disposed between the solder mask and the first built-up structure together with the electronic component, wherein the second built-up structure has a plurality of second conductive vias, a part of the second conductive vias electrically connect to the conductive pads of the first built-up structure, and another part of the second conductive vias electrically connect to the electrode pads of the electronic component.

7. The packaging substrate structure as claimed in claim 1, further comprising an adhesive layer disposed between the inactive surface of the electronic component and the surface of the core board.

8. The packaging substrate structure as claimed in claim 1, further comprising an adhesive material filling a gap between the cavity and the electronic component to fix the electronic component.

9. The packaging substrate structure as claimed in claim 1, wherein the width of the cavity increases from inside to outside.

* * * * *